United States Patent
Kodama (10) Patent No.: US 10,319,622 B2
(45) Date of Patent: Jun. 11, 2019

(54) SUBSTRATE CONVEYING METHOD AND SUBSTRATE PROCESSING SYSTEM

(71) Applicant: Tokyo Electron Limited, Tokyo (JP)

(72) Inventor: Toshiaki Kodama, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 43 days.

(21) Appl. No.: 15/414,703

(22) Filed: Jan. 25, 2017

(65) Prior Publication Data

US 2017/0221748 A1 Aug. 3, 2017

(30) Foreign Application Priority Data

Feb. 1, 2016 (JP) ................................ 2016-016863

(51) Int. Cl.
*H01L 21/68* (2006.01)
*H01L 21/677* (2006.01)

(52) U.S. Cl.
CPC ........ *H01L 21/68* (2013.01); *H01L 21/67742* (2013.01)

(58) Field of Classification Search
CPC ............................................... H01L 21/67742
USPC .................................................... 414/226.05
See application file for complete search history.

(56) References Cited

U.S. PATENT DOCUMENTS

| | | | | |
|---|---|---|---|---|
| 4,659,971 | A * | 4/1987 | Suzuki | G05B 19/425 318/568.19 |
| 5,537,311 | A * | 7/1996 | Stevens | G03F 7/7075 700/254 |
| 2013/0180448 | A1* | 7/2013 | Sakaue | H01L 21/67739 118/696 |

FOREIGN PATENT DOCUMENTS

| | | |
|---|---|---|
| JP | 62-067606 A | 3/1987 |
| JP | 2004-193344 A | 7/2004 |
| JP | 2013-042112 A | 2/2013 |

* cited by examiner

*Primary Examiner* — Ronald P Jarrett
(74) *Attorney, Agent, or Firm* — Abelman, Frayne & Schwab (57) ABSTRACT

Provided is a substrate conveying method including: holding a substrate by a holder; rotating the substrate while conveying the substrate; specifying a position of an edge of the substrate based on a position of the holder when the edge of the substrate crosses a facing surface of a sensor that is disposed on a conveyance trajectory of the substrate, and a position of the sensor; and removing an influence of the rotation of the substrate from the specified position of the edge of the substrate.

4 Claims, 7 Drawing Sheets

Prior Art

FIG.9B

Prior Art

SUBSTRATE CONVEYING METHOD AND SUBSTRATE PROCESSING SYSTEM

CROSS-REFERENCE TO RELATED APPLICATIONS

This application is based on and claims priority from Japanese Patent Application No. 2016-016863 filed on Feb. 1, 2016 with the Japan Patent Office, the disclosure of which is incorporated herein in its entirety by reference.

TECHNICAL FIELD

The present disclosure relates to a substrate conveying method and a substrate processing system. Particularly, the present disclosure relates to a substrate conveying method and a substrate processing system for conveying a substrate using a conveyance arm.

BACKGROUND

A substrate processing system, which performs a predetermined processing, for example, a film forming processing using plasma on a semiconductor wafer (hereinafter, simply referred to as a "wafer") as a substrate, includes a plurality of processing chambers and a conveyance chamber connected to each processing chamber, and carries a wafer into or from each processing chamber by a conveyance arm disposed in the conveyance chamber. Each processing chamber includes a placing table, and each wafer is placed on the placing table. However, in order to accurately perform a desired processing on the wafer, it is necessary to accurately place the wafer at a desired position on the placing table. Thus, the position of the wafer is measured by a sensor during the conveyance of the wafer by the conveyance arm, a displacement of the wafer from the desired position (hereinafter, referred to as a "positional displacement") is calculated, and a trajectory of the conveyance by the transport arm is adjusted so as to correct the positional displacement. In the following descriptions, a portion moving integrally between a node (bendable point) and another node in the transfer arm is referred to as a "link," and the tip portion (terminal portion) of the conveyance arm is referred to as an "end effector." Further, a two-link type conveyance arm refers to a conveyance arm having two links, and a one-link type conveyance arm refers to a conveyance arm having only one link.

In a conventional substrate processing system, a two-link scalar type or frog-leg type conveyance arm has been used as a conveyance arm. In the scalar type or frog-leg type conveyance arm, a bifurcated fork holding a wafer moves rectilinearly without rotating. For example, in a scalar type conveyance arm 90 illustrated in FIGS. 9A and 9B, two arm portions 93, 94, which connect a pedestal 91 and a fork 92, rotate. However, when the wafer W is conveyed as the arm portions are shifted from a contracting state (FIG. 9A) to the expanding state (FIG. 9B), the fork 92 and the wafer W moves rectilinearly, but the fork 92 and the wafer W do not rotate.

Figure 9A:
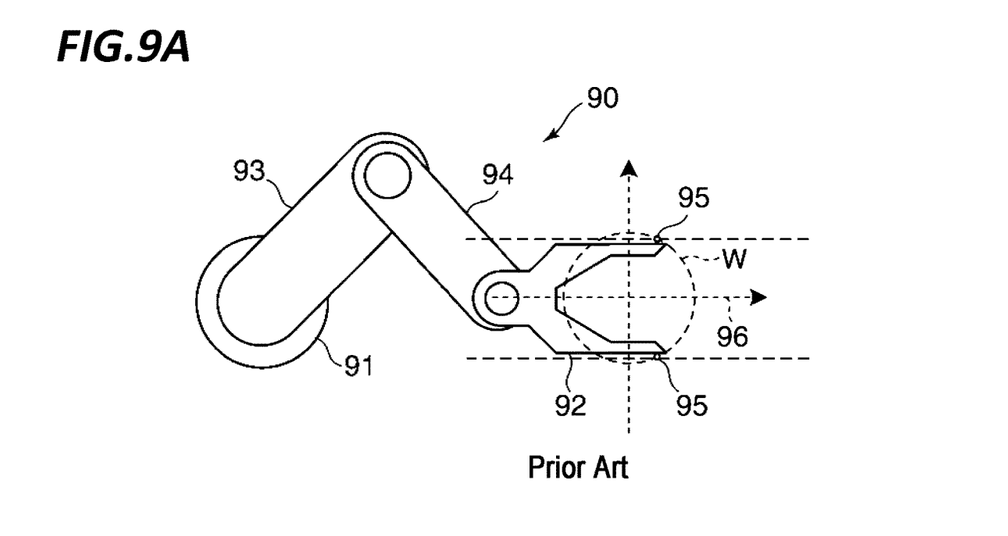
FIG. 9A illustrates the conveyance arm when contracted.
Figure 9B:
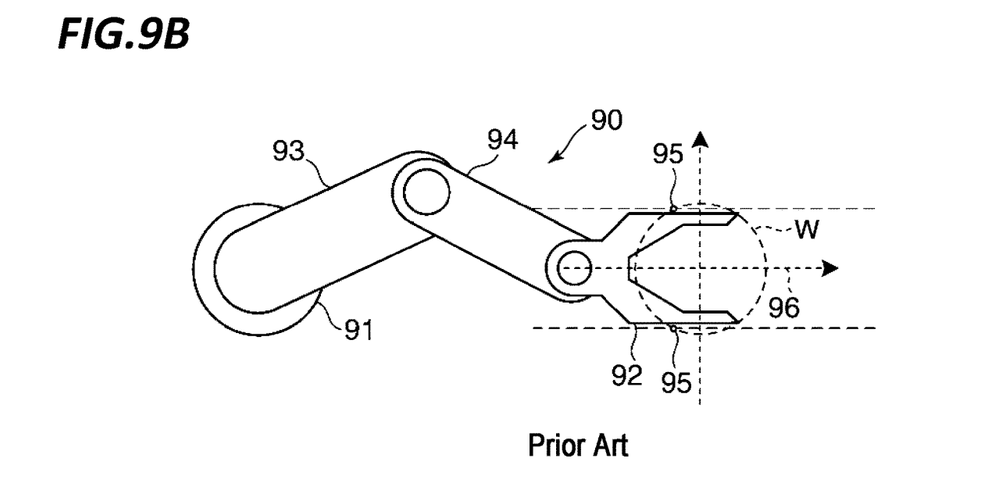
FIG. 9B illustrates the conveyance arm when expanded.

The substrate processing system specifies a position of an outer periphery (edge) of the wafer W from a positional relationship between a position of a sensor 95 disposed on a conveyance trajectory of the wafer W and a position of the center of the fork 92 of the conveyance arm 90 (a cross-shaped intersecting point indicated by the broken lines in FIGS. 9A and 9B) when the edge of the wafer W crosses a facing surface of the sensor 95 (covers the sensor 95). In general, two sensors 95 are provided, and the edge of the wafer W crosses the facing surfaces of each of the sensors 95 twice. Thus, four positions of the edge of the wafer W are specified. Then, a position of the center of the wafer W is calculated from the four specified positions of the edge to calculate the positional displacement of the wafer W (see, e.g., Japanese Patent Laid-Open Publication No. 2013-042112). At this time, the position of the center of the fork 92 and the position of the sensor 95 in a coordinate system based on the rectilinear direction of the wafer W (hereinafter, referred to as a "rectilinear direction coordinate system") may be specified from an encoder value of the conveyance arm 90. Meanwhile, in order to calculate the position of the center of the wafer W, each of the positions of the edge of the wafer W needs to be specified (plotted) in a coordinate system 96 based on the center of the fork 92 holding the wafer W (hereinafter, referred to as a "fork coordinate system"). However, as described above, since the fork 92 and the wafer W move rectilinearly without rotating, the rectilinear direction coordinate system coincides with the fork coordinate system 96 during the conveyance of the wafer W. Thus, each of the position of the edge of the wafer W specified in the rectilinear direction coordinate system may be regarded as each position of the edge of the wafer W in the fork coordinate system 96.

Incidentally, as the processing temperature of the wafer W has recently been increased, the wafer W may be heated to, for example, 700° C. to 800° C. in the processing chamber. In this case, the fork 92 and the arm portions 94 of the conveyance arm 90 are also heated by heat transfer from the heated wafer W. Thus, a bearing or a drive belt, which is embedded in the fork 92 or the arm portions 94, may be damaged by heat. Therefore, a one-link type conveyance arm has been suggested, which includes an end effector in which the fork 92 and the arm portions 94 are formed integrally in order to eliminate the bearing and the drive belt, thereby improving the heat resistance. In the one-link type conveyance arm, the end effector holds the wafer W when the wafer W is conveyed.

SUMMARY

In an aspect, the present disclosure provides a substrate conveying method including: holding a substrate by a holder; rotating the substrate while conveying the substrate; specifying a position of an edge of the substrate based on a position of the holder when the edge of the substrate crosses a facing surface of a sensor that is disposed on a conveyance trajectory of the substrate, and a position of the sensor; and removing an influence of the rotation of the substrate from the specified position of the edge of the substrate.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 2A and 2B are plan views for explaining the configuration of the conveyance arm in FIG. 1.

FIGS. 9A and 9B are plan views for explaining a configuration of a conventional conveyance arm.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the one-link type conveyance arm, since the end effector corresponds to the arm portions 94, the end effector rotates during the conveyance of the wafer W, and thus, the wafer W also rotates. Accordingly, the fork coordinate system rotates with respect to the rectilinear direction coordinate system during the conveyance of the wafer W. As a result, each of the positions of the edge of the wafer W specified in the rectilinear direction coordinate system may not be regarded as each of the positions of the edge of the wafer W in the fork coordinate system. Thus, the position of the center of the wafer W may not be accurately calculated.

An object of the present disclosure is to provide a substrate conveying method and a substrate processing system capable of accurately calculating the position of the center of the wafer W.

In an aspect, the present disclosure provides a substrate conveying method including: holding a substrate by a holder; rotating the substrate while conveying the substrate; specifying a position of an edge of the substrate based on a position of the holder when the edge of the substrate crosses a facing surface of a sensor that is disposed on a conveyance trajectory of the substrate, and a position of the sensor; and removing an influence of the rotation of the substrate from the specified position of the edge of the substrate.

In the above-described substrate conveying method, the removing the influence of the rotation of the substrate includes rotationally moving the specified position of the edge of the substrate by a rotation angle of the substrate.

In the above-described substrate conveying method, the conveying system is a one-link type arm.

In another aspect, the present disclosure provides a substrate processing system including: a conveying system including a holder that holds a substrate; a sensor disposed on a conveyance trajectory of the substrate; and a controller. The conveying system rotates the substrate while conveying the substrate. The controller specifies a position of an edge of the substrate based on a position of the holder when the edge of the substrate crosses a facing surface of the sensor and a position of the sensor, and removes an influence of the rotation of the substrate from the specified position of the edge of the substrate.

According to the present disclosure, the substrate rotates when conveyed, while the position of the edge of the substrate, which has been specified based on the position of the holder when the edge of the substrate crosses the facing surface of the sensor and the position of the sensor, is rotationally moved by a rotation angle of the substrate. Therefore, the position of the edge of the substrate in the fork coordinate system may be specified from the specified position of the edge of the substrate, and thus, the position of the center of the substrate in the fork coordinate system may be accurately calculated.

Hereinafter, an exemplary embodiment of the present disclosure will be described in detail with reference to the drawings.

Figure 1:
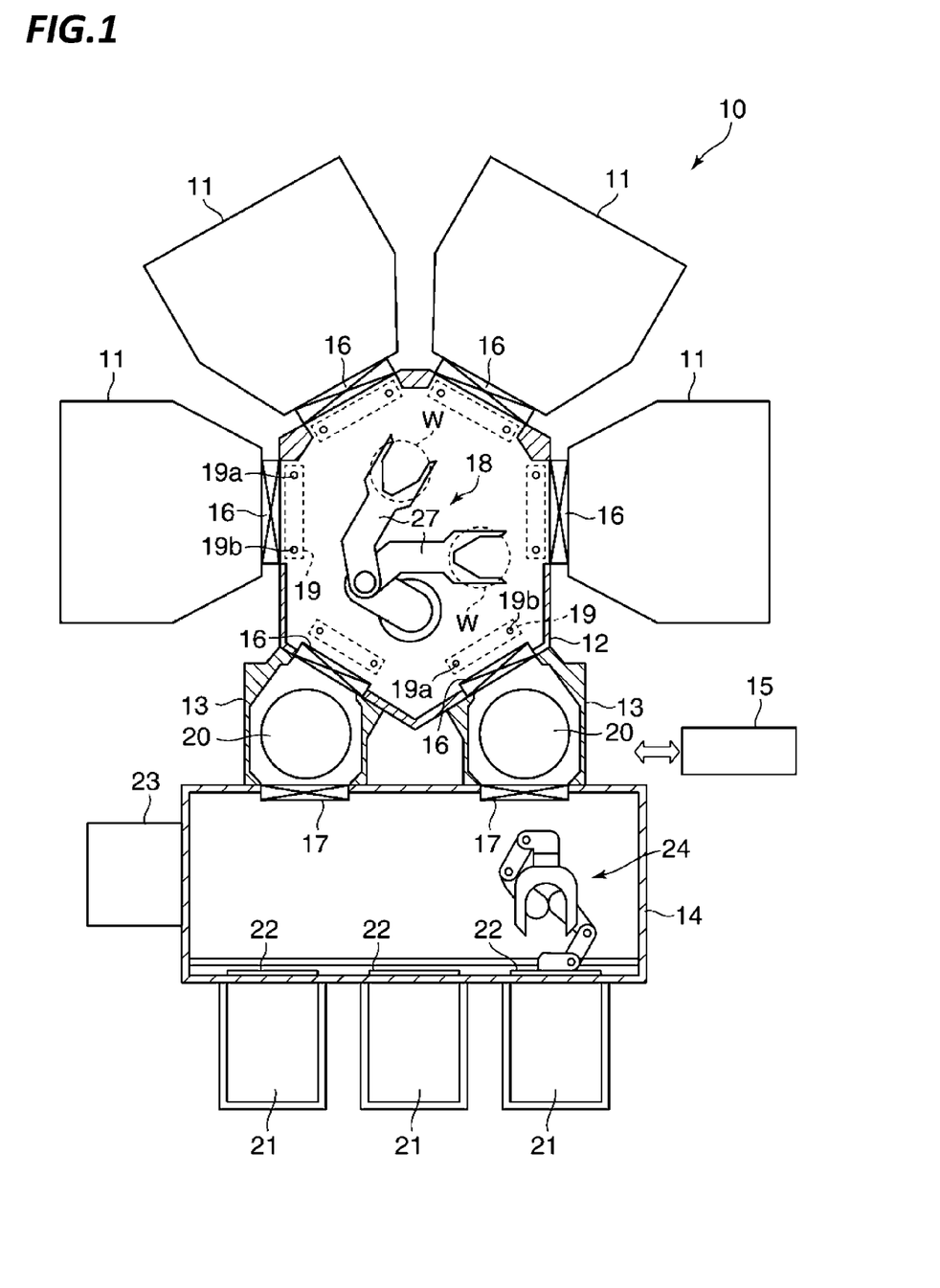
FIG. 1 is a plan view illustrating a schematic configuration of a substrate processing system according to an exemplary embodiment of the present disclosure.

FIG. 1 is a plan view illustrating a schematic configuration of a substrate processing system according to an exemplary embodiment of the present disclosure. For the convenience of explanation, FIG. 1 is illustrated, so that a part of internal components is seen through.

A substrate processing system 10 includes: four (4) vacuum processing chambers 11 in which a film forming processing (i.e., a high temperature processing) is performed; a vacuum conveyance chamber 12 that is connected to each vacuum processing chamber 11; two load lock chambers 13 that are connected to the vacuum conveyance chamber 12 such that the inside of the two load lock chambers 13 is switchable between an atmospheric pressure state and a vacuum state; a loading/unloading chamber 14 that are connected to the vacuum processing chambers 11 via the load lock chambers 13 interposed therebetween; and a controller 15 (control unit) that controls the operation of the respective components. A gate 16 is disposed between each vacuum processing chamber 11 and the vacuum conveyance chamber 12, and between each load lock chamber 13 and the vacuum conveyance chamber 12, and a gate 17 is disposed between each load lock chamber 13 and the carry-in/out chamber 14.

The vacuum conveyance chamber 12 includes therein one (1) conveyance arm 18 (conveying system) that conveys a wafer W between each vacuum processing chamber 11 and each load lock chamber 13, and six (6) sensor units 19 disposed in front of the gates 16, respectively. The conveyance arm 18 includes two end effectors 27 (to be described later). The two end effectors 27 are disposed to overlap each other. Each sensor unit 19 includes two transmissive optical sensors 19a, 19b, and specifies a position of a periphery (edge) of a wafer W conveyed between each vacuum processing chamber 11 and each load lock chambers 13 by the conveyance arm 18. Each load lock chamber 13 includes a stage 20 therein, and delivers a wafer W between the vacuum conveyance chamber 12 and the carry-in/out chamber by placing the wafer W on the stage 20. The carry-in/out chamber 14 includes three (3) ports 22 each serving as a wafer W carry-in/out port to which a container 21 accommodating a plurality of wafers W is attached, an orienter 23 that adjusts a position of a wafer W, and a conveyance arm 24 that conveys a wafer W between the orienter 23 and each load lock chamber 13.

In the substrate processing system 10, when a wafer W is carried into each vacuum processing chamber 11 or carried out from each vacuum processing chamber 11 by the conveyance arm 18, each sensor unit 19 specifies the position of the edge of the wafer W and calculates the position of the center of the wafer W from the specified position of the edge of the wafer W to calculate the positional displacement of the wafer W. Then, the conveyance trajectory of the wafer W is adjusted to correct the calculated positional displacement of the wafer W.

Figure 2A:
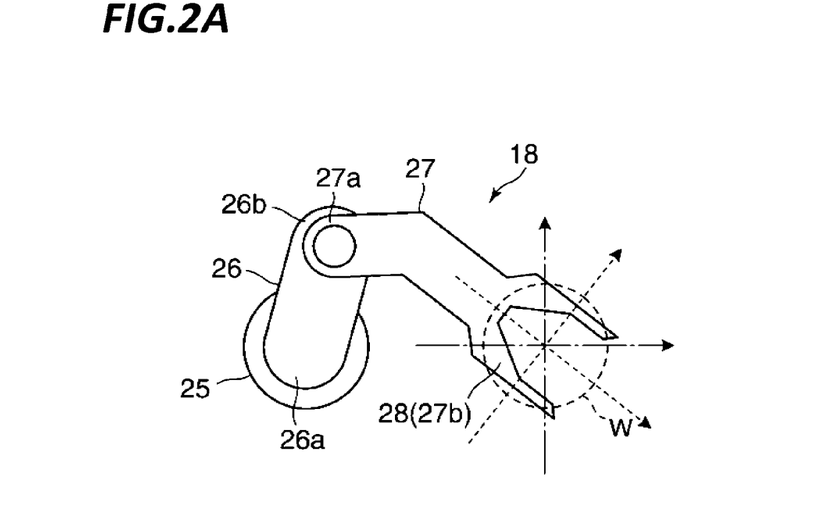
FIG. 2A illustrates the conveyance arm when contracted.
Figure 2B:
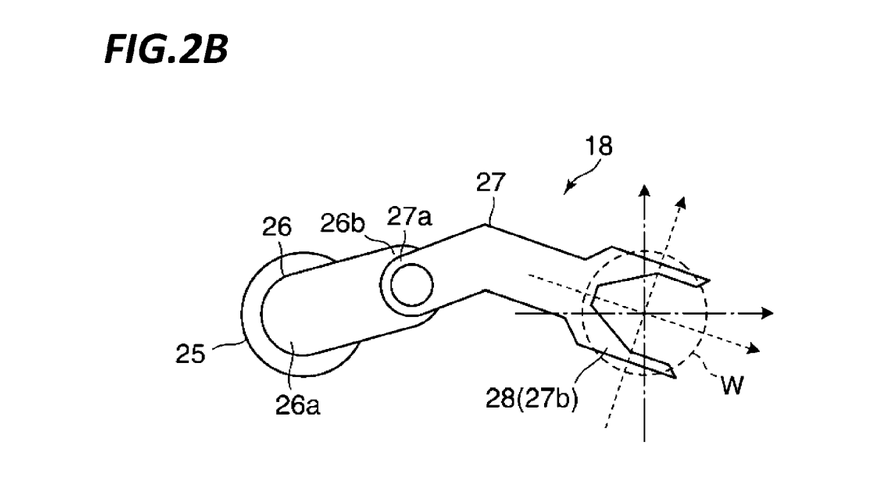
FIG. 2B illustrates the conveyance arm when expanded.

FIGS. 2A and 2B are plan views for explaining the configuration of the conveyance arm in FIG. 1. FIG. 2A illustrates the conveyance arm when contracted, and FIG. 2B illustrates the conveyance arm when expanded.

In FIGS. 2A and 2B, the conveyance arm 18 includes a cylindrical pedestal 25, an arm portion 26, and two end effects 27 arranged to overlap each other. In FIGS. 2A and 2B and the subsequent drawings, one of the two end effectors 27 is omitted in the conveyance arm 18. Further, one end 26a of the arm portion 26 is attached to the pedestal 25, and is pivoted horizontally around the central axis of the pedestal 25 by a built-in drive belt. The end effector 27 is formed of an elongated plate-like member that is bent in the middle, and the one end 27a is attached to the other semicircular end 26b of the arm portion 26. The end effector 27 is pivoted horizontally around the central axis of the other end 26b of the arm portion 26 by the drive belt built in the arm portion 26. A bifurcated fork 28 (holding unit) is formed at the other end 27b of the end effector 27, and the fork 28 holds the wafer W. Further, the end effector 27 is made of a bulk material, which does not include a mechanical mechanism therein, for example, a heat resistant material (e.g., a ceramic).

In the conveyance arm 18, the arm portion 26 and the end effector 27 cooperate while adjusting the rotation angle, so that the wafer W held by the fork 28 is moved rectilinearly (moved in the horizontal direction in the drawing) and is conveyed. However, since the fork 28 is formed integrally with the end effector 27, and the end effector 27 is pivoted around the central axis of the other end 26b of the arm portion 26 during the conveyance of the wafer W, the fork 28 is also rotationally moved. Therefore, the wafer W held by the fork 28 is also rotated. Specifically, as illustrated in FIG. 2A or FIG. 2B, a coordinate system based on the center of the fork 28 indicated by the broken line (hereinafter, referred to as a "fork coordinate system") is rotated with respect to a coordinate system based on the rectilinear direction of the wafer W indicated by the alternate long and short dash line (hereinafter, referred to as a "rectilinear direction coordinate system"). Further, the rotation angle of the fork coordinate system with respect to the rectilinear direction coordinate system differs between a case where the conveyance arm 18 is contracted (FIG. 2A) and a case where the conveyance arm 18 is expanded (FIG. 2B).

FIGS. 3A to 3D are views for explaining how an edge of a wafer crosses a facing surface of each optical sensor (covers the sensor) during the conveyance of the wafer. In FIGS. 3A to 3D, the conveyance arm 18 is illustrated in a simplified manner with priority on viewability.

Figure 3A:
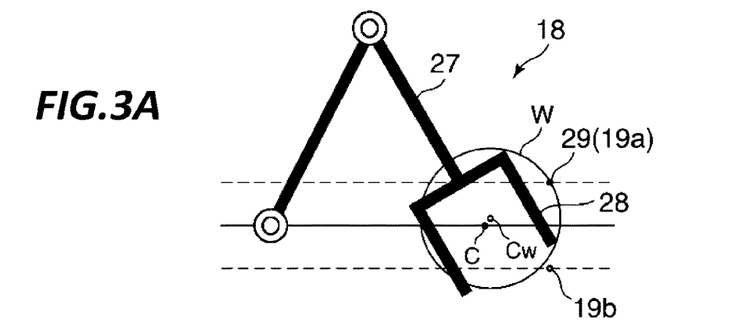
FIGS. 3A to 3D are views for explaining how an edge of a wafer crosses a facing surface of each optical sensor during the conveyance of the wafer.
Figure 3B:
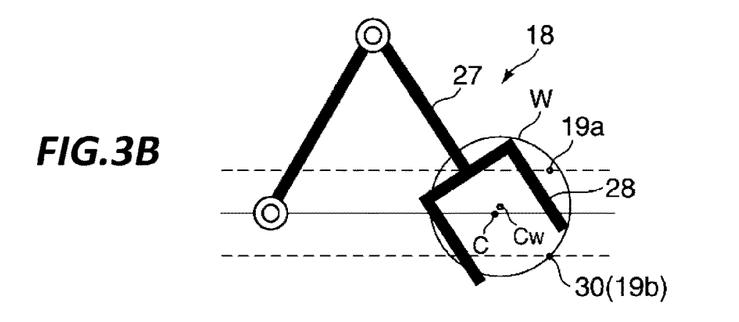
Figure 3C:
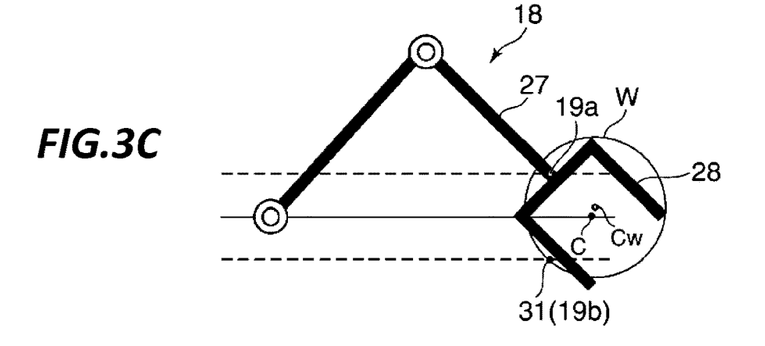
Figure 3D:
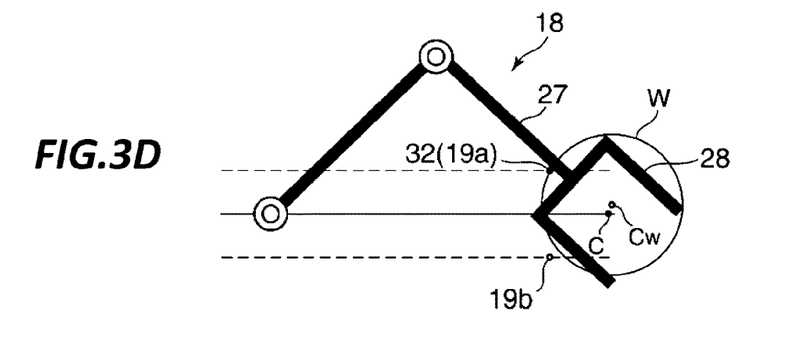

As illustrated in FIGS. 3A to 3D, during the conveyance of the wafer W, the edge of the wafer W crosses the facing surfaces of the optical sensors 19a, 19b twice for each facing surface, that is, four times in total. Specifically, during the conveyance of the wafer W, one point 29 on the edge of the wafer W first crosses the facing surface of the optical sensor 19a (FIG. 3A), one point 30 of the edge of the wafer W crosses the facing surface of the optical sensor 19b (FIG. 3B), one point 31 on the edge of the wafer W crosses the facing surface of the optical sensor 19b (FIG. 3C), and one point 32 on the edge of the wafer W crosses the facing surface of the optical sensor 19a (FIG. 3D). At this time, the position of one point 29 (30, 31, or 32) is specified from the relative positional relationship between the position of the center of the fork 28 when the point 29 (30, 31, or 32) on the edge of the wafer W crosses the facing surface of the optical sensor 19a (or 19b), and the position of the sensor 19a (or 19b). In the substrate processing system 10, the position of the center of the fork 28 is calculated from an encoder value of the conveyance arm 18. However, since only the position in the rectilinear direction coordinate system is calculated from the encoder value, the position of one point 29 (30, 31, or 32) on the edge of the wafer W is specified in the rectilinear direction coordinate system.

In order to calculate the position of the center of the wafer W, it is originally necessary to specify the positions of the respective points on the edge of the wafer W in a coordinate system based on the center of the wafer W (hereinafter, referred to as a "wafer coordinate system"), but the position of the center of the wafer W is unknown. Meanwhile, since the wafer W is rotated integrally with the fork 28, the fork coordinate system is not rotated with respect to the wafer coordinate system. Therefore, in the exemplary embodiment, the positions of the respective points on the edge of the wafer W in the fork coordinate system are specified, and the position of the center of the wafer W in the fork coordinate system is calculated from the specified positions of the respective points on the edge. Further, as described above, the positions of the respective points on the edge of the wafer W calculated from the relative positional relationship between the position of the center of the fork 28 and the position of the optical sensor 19a (or 19b), are specified in the rectilinear direction coordinate system. Thus, in the exemplary embodiment, in order to specify the positions of the respective points on the edge of the wafer W in the fork coordinate system, the positions of the respective points on the edge of the wafer W specified in the rectilinear direction coordinate system, are converted into the positions in the fork coordinate system.

Figure 4A:
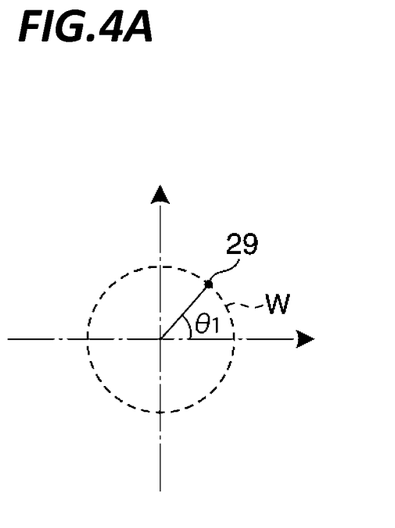
FIGS. 4A and 4B are views for explaining a relationship between one point on the edge of the wafer of which the position is specified and a rectilinear direction coordinate system or a fork coordinate system.
Figure 4B:
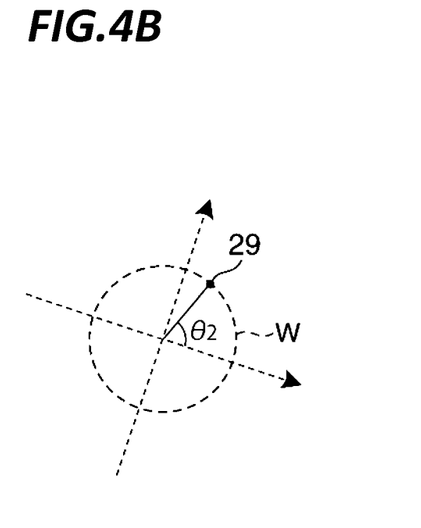

FIGS. 4A and 4B are views for explaining a relationship between one point on the edge of the wafer of which the position is specified and a rectilinear direction coordinate system or a fork coordinate system. In FIGS. 4A and 4B, descriptions will be made on one point 29 among four points 29 to 32 on the edge of which the positions are specified.

When one point 29 (FIG. 4A) on the edge of the wafer W of which the position is specified in the rectilinear direction coordinate system (alternate long and short dash line) is plotted in the fork coordinate system (broken line) (FIG. 4B), the rotation angle θ1 of the position of the point 29 in the rectilinear direction coordinate system is different from the rotation angle θ2 of the position of the point 29 in the fork coordinate system because the fork coordinate system is rotating with respect to the coordinate system. Therefore, in order to convert the position of the point 29 in the rectilinear direction coordinate system into the position in the fork coordinate system, the point 29 in the rectilinear direction coordinate system needs to be rotationally moved by a difference angle between the rotation angle θ2 and the rotation angle θ1. Here, the difference angle between the rotation angle θ2 and the rotation angle θ1 refers to a rotation angle of the fork coordinate system with respect to the rectilinear direction system when the position of one point 29 is specified (when one point 29 crosses the facing surface of the optical sensor 19a).

Figure 5:
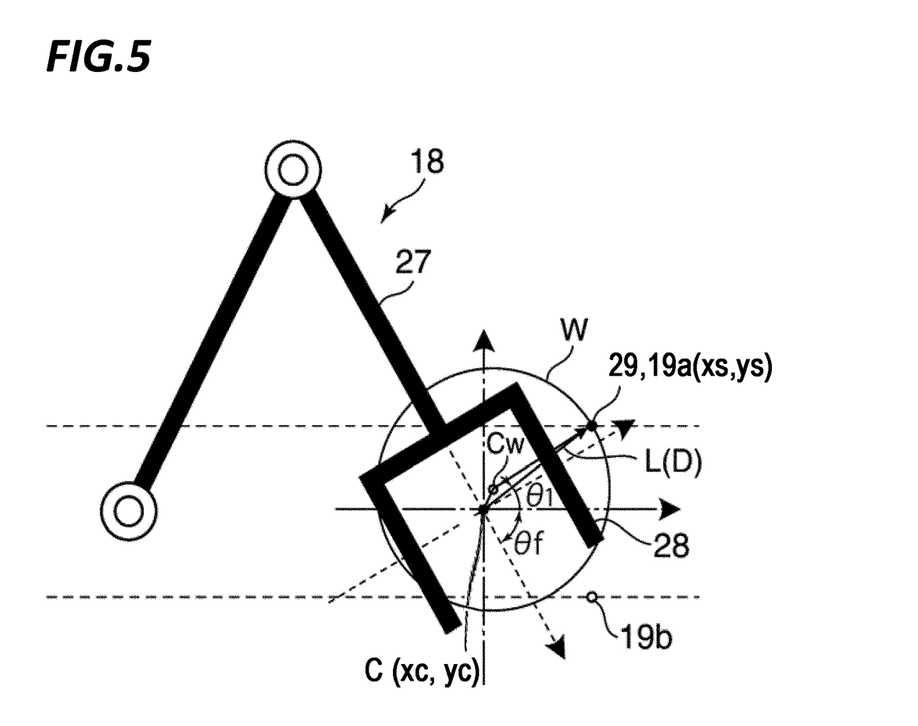
FIG. 5 is a view for explaining a method of converting a position of one point on the edge of the wafer specified in the rectilinear direction coordinate system to a position in the fork coordinate system.
Figure 6:
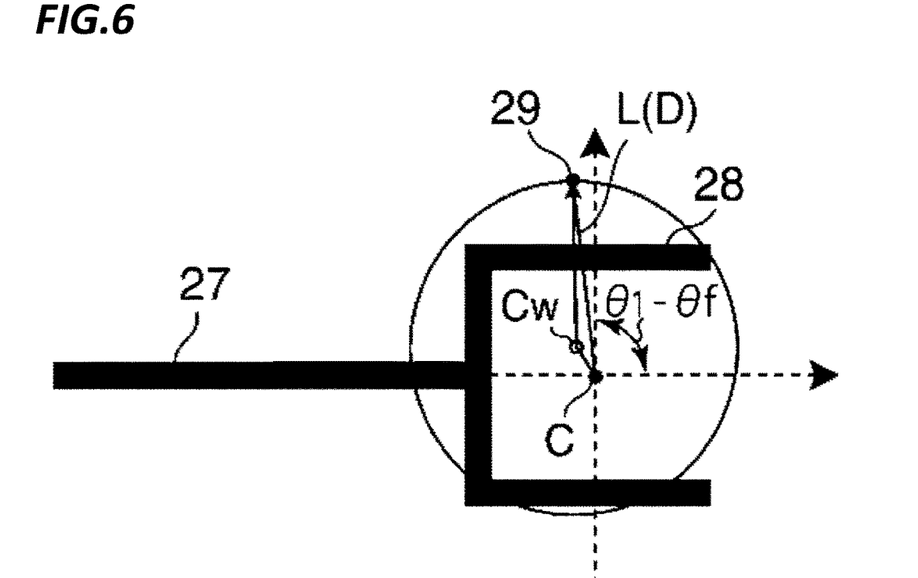
FIG. 6 is a view for explaining a method of converting a position of one point on the edge of the wafer specified in the rectilinear direction coordinate system to a position in the fork coordinate system.

FIGS. 5 and 6 are views for explaining a method of converting a position of one point on the edge of the wafer specified in the rectilinear direction coordinate system to a position in the fork coordinate system.

First, a position (xc, yc) of the center C of the fork 28 in the rectilinear direction coordinate system when one point 29 on the edge of the wafer W crosses the facing surface of the optical sensor 19a, is calculated from the encoder value of the conveyance arm 18, and a position (xs, ys) of the optical sensor 19a (the point 29) in the rectilinear direction coordinate system is also calculated from the encoder value of the conveyance arm 18 (first step). Subsequently, a distance D of a line segment L connecting the position (xc, yc) of the center C of the fork 28 and the position (xs, ys) of the point 29 is calculated from Equation (1) below.

$$D=\sqrt{(x_s-x_c)^2+(y_s-y_c)^2} \quad (1)$$

Here, the rotation angle of the fork 28 in the rectilinear direction coordinate system when the point 29 crosses the facing surface of the optical sensor 19a, refers to a rotation angle of the fork coordinate system with respect to the rectilinear direction coordinate system when the position of the point 29 is specified. Therefore, the rotation angle of the fork 28 when the position of the point 29 is specified is calculated as a rotation angle $\theta f$ of the fork coordinate system with respect to the rectilinear direction coordinate system when the position of the point 29 is specified, from the encoder value (at this time, $\theta f$ is calculated as a negative angle). Further, the rotation angle $\theta 1$ of the position of the point 29 in the rectilinear direction coordinate system is calculated from Equation (2) below.

$$\theta_1 = \arctan 2((y_s-y_c),(x_s-x_c)) \quad (2)$$

At this time, the position of the point 29 in the fork coordinate system corresponds to a coordinate of the vertex of the line segment L when the line segment L is rotated at a rotation angle $(\theta 1-\theta f)$ in the fork coordinate system. Therefore, the position (xf, yf) of the point 29 in the fork coordinate system is calculated from Equations (3) and (4) below (second step).

$$x_f = D \times \cos(\theta_1 - \theta_f) \quad (3)$$

$$y_f = D \times \sin(\theta_1 - \theta_f) \quad (4)$$

Figure 7:
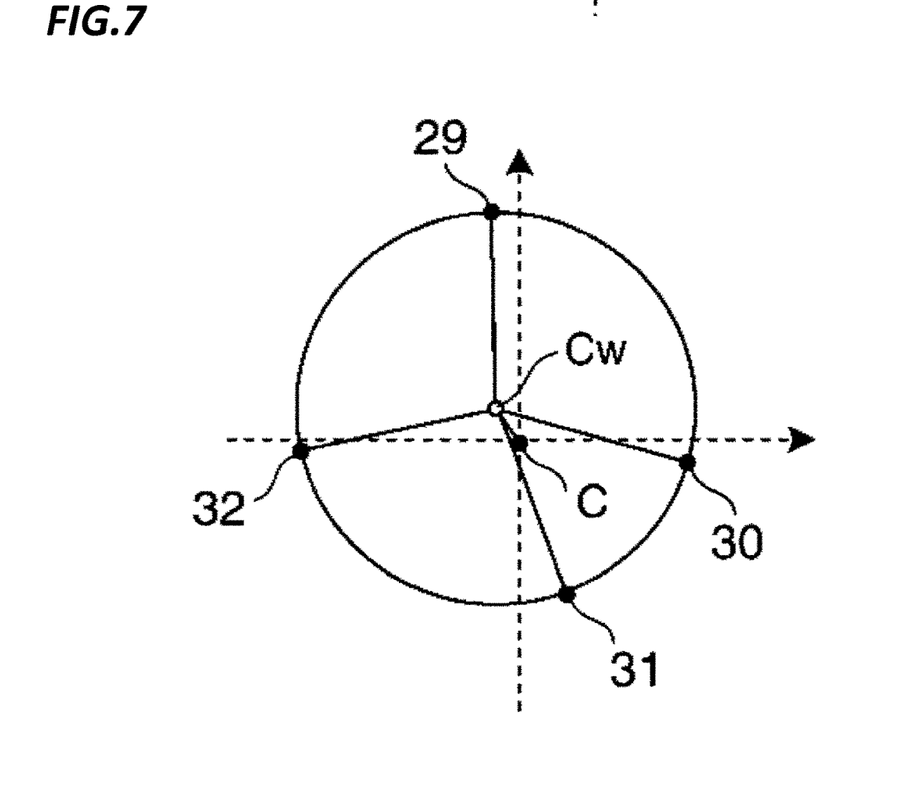
FIG. 7 is a view for explaining a method of calculating a position of the center of the wafer in the fork coordinate system.

Further, for the other three points 30 to 32 on the edge of the wafer W of which the positions are specified in the rectilinear direction coordinate system, the positions thereof in the fork coordinate system are also calculated by using the same method as the conversion method of FIGS. 5 and 6. Thereafter, as illustrated in FIG. 7, the points 29 to 32 are plotted in the fork coordinate system, and the position of the center Cw of the wafer W in the fork coordinate system is calculated based on the positions of the respective points 29 to 32.

According to the exemplary embodiment, although the wafer W is rotated during the conveyance, the positions of the respective points on the edge of the wafer W specified in the rectilinear direction coordinate system are converted into the positions in the fork coordinate system. Specifically, the positions of the respective points on the edge of the wafer W specified in the rectilinear direction coordinate system are rotationally moved by the rotation angle $\theta f$ in the fork coordinate system with respect to the rectilinear direction coordinate system (in the exemplary embodiment, the rotation angle of the fork coordinate system is the same as the rotation angle of the wafer coordinate system), as expressed by Equations (3) and (4). Therefore, the positions of the respective points on the edge of the wafer W in the fork coordinate system may be specified from the positions of the respective points on the edge of the wafer W specified in the rectilinear direction coordinate system, and thus, the position of the center Cw of the wafer W may be accurately calculated.

The present disclosure has been described using an exemplary embodiment, but the present disclosure is not limited to the above-described exemplary embodiment.

Figure 8:
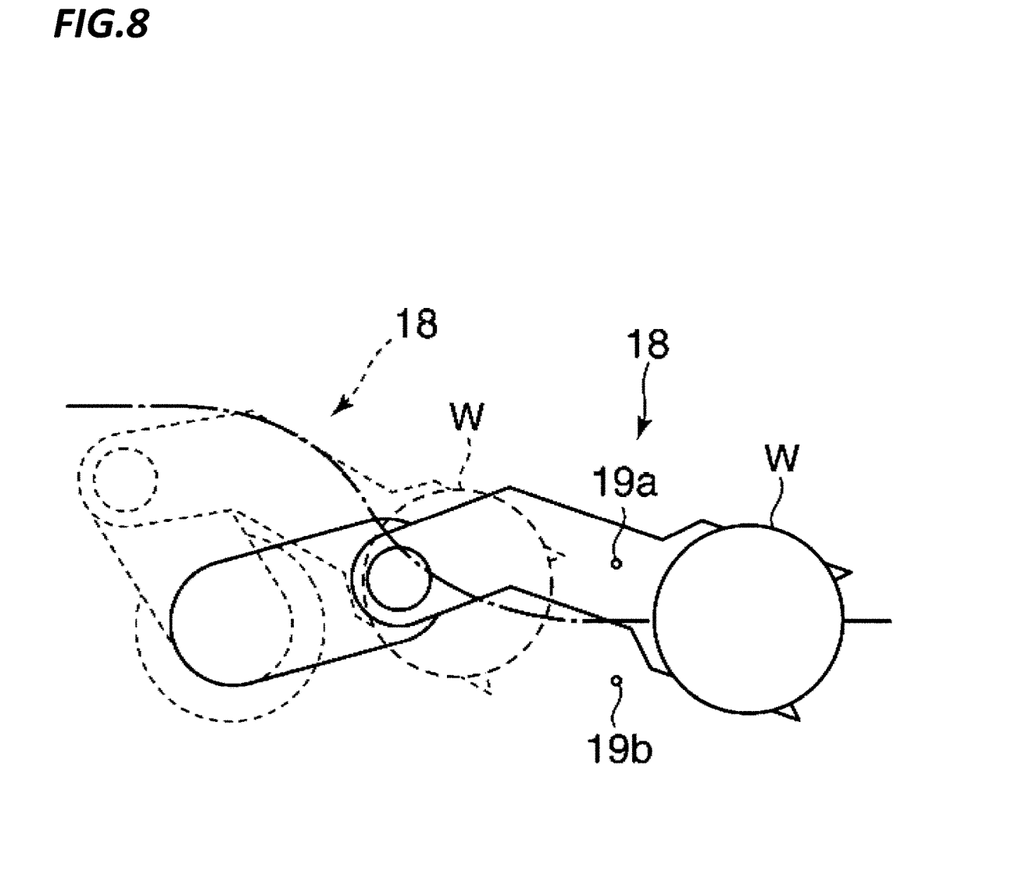
FIG. 8 is a view illustrating an exemplary conveyance trajectory to which the present disclosure is applicable.

In the exemplary embodiment, the position of the center Cw of the wafer W may be accurately calculated even when the wafer W is rotated during the conveyance. Thus, the present disclosure may also be applied to the case where the wafer W is conveyed by the conveyance arm 18 along a so-called banana hook trajectory (indicated by the alternate long and short dash line in the drawing) without moving rectilinearly for example, as illustrated in FIG. 8, so that the wafer W rotates.

In addition, although the conveyance arm 18 is a one-link type conveyance arm, the present disclosure may also be applied to a case where the conveyance arm 18 is a two-link scalar type or frog-leg type conveyance arm as long as it rotates when the wafer W is conveyed.

Further, the object of the present disclosure is also achieved by supplying a storage medium storing a program code of software for realizing the functions of the above-described exemplary embodiments to, for example, a computer (not illustrated) provided in the controller 15, and reading and executing the program code stored in the storage medium by the CPU of the computer.

In this case, the program code itself, which is read from the storage medium, realizes the functions of the above-described exemplary embodiments, and the program code and the storage medium storing the program code constitute the present disclosure.

Further, the storage medium for supplying the program code may be any storage medium that is capable of storing the program code, such as, for example, a RAM, an NV-RAM, a floppy disk (registered trademark), a hard disk, a magneto-optical disk, an optical disk (e.g., a CD-ROM, a CD-R, a CD-RW, a DVD (DVD-ROM, DVD-RAM, DVD-RW, DVD+RW)), a magnetic tape, a nonvolatile memory card, or another ROM. Alternatively, the program code may be downloaded from, for example, a database or another computer (not illustrated) connected to, for example, the Internet, a commercial network, or a local area network, and supplied to the computer.

Further, the present disclosure includes a case where the functions of the above-described exemplary embodiment are realized by executing the program code read out by the computer, as well as a case where, for example, an operating system (OS) that operates on the CPU performs a part or all of the actual processing based on the instruction of the program code, and the function of the above-described exemplary embodiment is realized by the processing.

Furthermore, the present disclosure includes a case where, after the program code read out from the storage medium is written in a memory provided in a function expansion board inserted in the computer or a function expansion unit connected to the computer, a CPU, for example, included in the function expansion board or the function expansion unit performs a part or all of the actual processing, and the functions of the above-described exemplary embodiments are realized by the processing.

The form of the program code may be, for example, an object code, a program code executed by an interpreter, and script data supplied to an OS.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A substrate conveying method comprising:
holding a substrate by a holder capable of applying rotational movement;
rotating the substrate while conveying the substrate held by the holder;
specifying, by a controller, a position of an edge of the substrate based on a position of the holder when the edge of the substrate crosses a stationary sensor that is disposed along a conveyance trajectory of the substrate, and a position of the sensor, the position of the edge of the substrate being defined relative to a stationary rectilinear coordinate system;
converting, by the controller, the specified position of the edge of the substrate from being defined relative to the stationary rectilinear coordinate system to being defined relative to a rotatable fork coordinate system of the holder by rotationally moving the specified position of the edge of the substrate by a difference angle defined by a difference between a rotation angle of the position of the edge of the substrate in the fork coordinate system and a rotation angle of the position of the edge of the substrate in the rectilinear coordinate system, thereby removing an influence of the rotation of the substrate from the specified position of the edge of the substrate.

2. The substrate conveying method of claim 1, wherein the conveying system is a one-link arm.

3. A substrate processing system comprising:
a conveying system including a holder that holds a substrate the holder being capable of applying rotational movement;
a stationary sensor disposed along a conveyance trajectory of the substrate; and
a controller,
wherein the holder rotates the substrate while conveying the substrate, and the controller specifies a position of a center of the substrate based on a position of the holder when the edge of the substrate crosses the stationary sensor and a position of the sensor, and the controller is configured to adjust the conveyance trajectory of the substrate by converting a specified position of the edge of the substrate from being defined relative to the stationary rectilinear coordinate system to being defined relative to a rotatable fork coordinate system of the holder,
wherein the converting of the specified position of the edge of the substrate includes rotationally moving the specified position of the edge of the substrate by a difference angle defined by a difference between a rotation angle of the position of the edge of the substrate in the fork coordinate system and a rotation angle of the position of the edge of the substrate in the rectilinear coordinate system.

4. The substrate processing system of claim 3, wherein the conveying system is a one-link arm.

* * * * *